United States Patent
Woo et al.

(10) Patent No.: US 10,050,008 B1
(45) Date of Patent: Aug. 14, 2018

(54) METHOD AND SYSTEM FOR AUTOMATIC BOND ARM ALIGNMENT

(71) Applicant: ASM Technology Singapore Pte Ltd, Singapore (SG)

(72) Inventors: Shui Cheung Woo, Hong Kong (HK); Liang Hong Tang, Hong Kong (HK); Wan Yin Yau, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 37 days.

(21) Appl. No.: 15/413,605

(22) Filed: Jan. 24, 2017

(51) Int. Cl.
*B23K 31/02* (2006.01)
*H01L 23/00* (2006.01)
*B23K 1/00* (2006.01)
*B23K 3/06* (2006.01)
*B23K 3/00* (2006.01)
*B23K 101/40* (2006.01)

(52) U.S. Cl.
CPC ............ *H01L 24/75* (2013.01); *B23K 1/0016* (2013.01); *B23K 3/00* (2013.01); *B23K 3/0623* (2013.01); *B23K 2201/40* (2013.01); *H01L 2224/759* (2013.01); *H01L 2224/75702* (2013.01); *H01L 2224/75823* (2013.01)

(58) Field of Classification Search
CPC .............. H01L 24/75; H01L 2224/759; H01L 2224/75823; H01L 2224/75702; B23K 3/0623; B23K 1/0016; B23K 2201/40; B23K 2201/36–2201/42; B23K 3/00–3/087

USPC ............... 228/4.1–6.2, 8–12, 44.7, 49.5, 228/179.1–180.22

See application file for complete search history.

(56) References Cited

U.S. PATENT DOCUMENTS

| | | | | | |
|---|---|---|---|---|---|
| 5,180,094 | A | * | 1/1993 | Yanagida | B23K 20/005 228/4.5 |
| 6,135,702 | A | * | 10/2000 | Huang | B25J 19/06 414/729 |
| 2002/0029468 | A1 | * | 3/2002 | Koike | H05K 13/0413 29/832 |
| 2002/0083579 | A1 | * | 7/2002 | Suhara | H05K 13/0015 29/739 |
| 2002/0089655 | A1 | * | 7/2002 | Kida | G03F 7/70691 355/72 |
| 2002/0167801 | A1 | * | 11/2002 | Suhara | H05K 13/0413 361/728 |

(Continued)

*Primary Examiner* — Kiley Stoner
(74) *Attorney, Agent, or Firm* — Ostrolenk Faber LLP

(57) ABSTRACT

A method, as well as a system implementing the method, for automatically aligning a bond arm with respect to a bonding support surface for supporting a substrate during a bonding process. The method comprises: rotating the bond arm for a first revolution around a longitudinal axis through a bond head moveably coupled to the bond arm, the first revolution including a plurality of predefined rotary angular positions; pausing the rotation of the bond arm at each of the plurality of rotary angular positions; determining a tilt angle of the bond arm relative to the bonding support surface during each pause at the respective rotary angular position; and selecting the rotary angular position of the bond arm which has a tilt angle that satisfies a predefined specification such that the bond arm is aligned substantially perpendicular to the bonding support surface.

11 Claims, 13 Drawing Sheets

(56) References Cited

U.S. PATENT DOCUMENTS

| | | | | |
|---|---|---|---|---|
| 2002/0184755 | A1* | 12/2002 | Suhara | H05K 13/0069 |
| | | | | 29/833 |
| 2003/0034741 | A1* | 2/2003 | Jang | H01L 21/68764 |
| | | | | 315/111.81 |
| 2003/0041878 | A1* | 3/2003 | Shimada | B08B 1/00 |
| | | | | 134/6 |
| 2004/0231148 | A1* | 11/2004 | Andersch | H05K 13/0408 |
| | | | | 29/749 |
| 2005/0109815 | A1* | 5/2005 | Kakutani | B23K 20/004 |
| | | | | 228/9 |
| 2008/0222883 | A1* | 9/2008 | Ono | B23P 21/004 |
| | | | | 29/787 |
| 2011/0215134 | A1* | 9/2011 | Sim | H01L 21/67144 |
| | | | | 228/101 |
| 2013/0153644 | A1* | 6/2013 | Hojo | H01L 24/16 |
| | | | | 228/102 |
| 2013/0181037 | A1* | 7/2013 | Nagai | H01L 24/75 |
| | | | | 228/103 |
| 2014/0030052 | A1* | 1/2014 | Kostner | B25J 15/0095 |
| | | | | 414/749.6 |
| 2017/0162421 | A1* | 6/2017 | Sakaue | H01L 21/67706 |
| 2017/0304986 | A1* | 10/2017 | Ueno | B24B 37/0053 |
| 2017/0318714 | A1* | 11/2017 | Nishiyama | H05K 13/0408 |

* cited by examiner

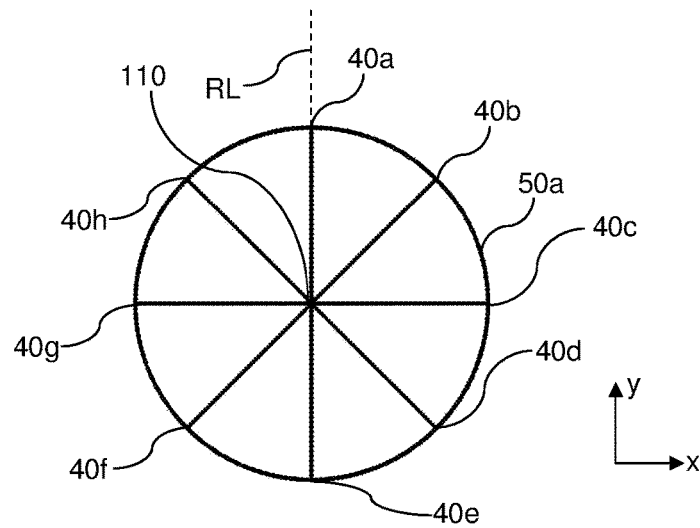
FIG. 5B
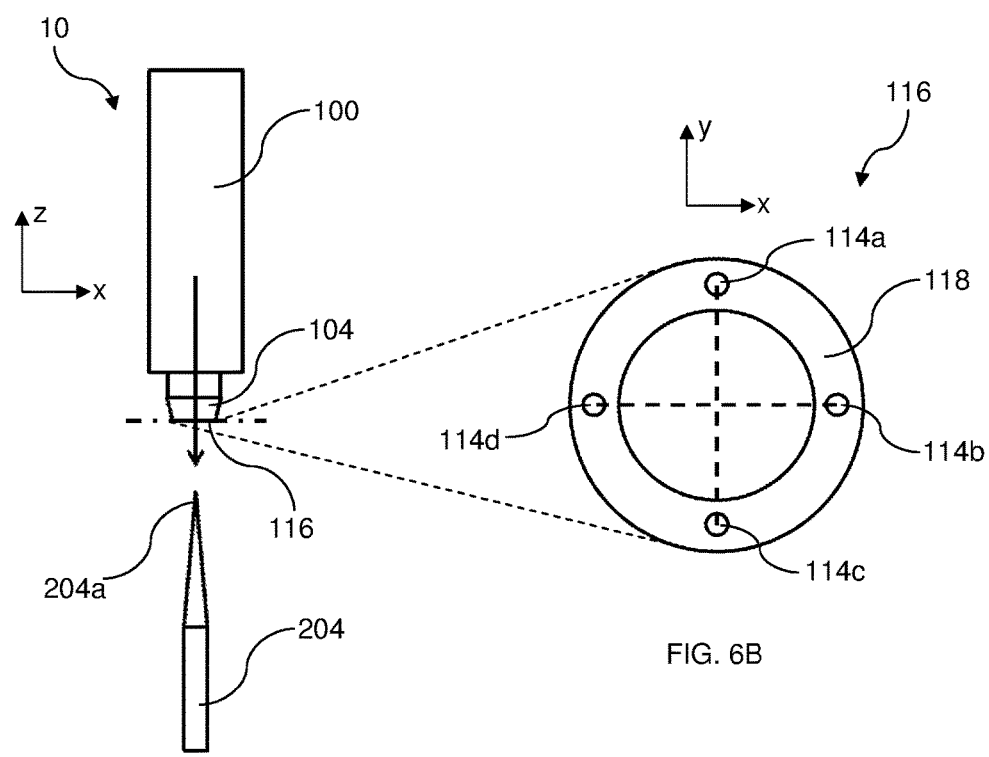
FIG. 6A
FIG. 6B

METHOD AND SYSTEM FOR AUTOMATIC BOND ARM ALIGNMENT

TECHNICAL FIELD

The present disclosure generally relates to a method and system for automatic bond arm alignment. More particularly, the present disclosure describes various embodiments of a method and a system implementing such a method for automatically aligning a bond arm with respect to a bonding support surface for supporting a substrate during a bonding process.

BACKGROUND

Flip chip bonding is a process for interconnecting semiconductor devices, components, or dies to a circuit board, wafer, or substrate. The semiconductor devices have solder bumps that are deposited on the chip pads on the top surface of the semiconductor devices. The semiconductor devices are then flipped over by a flip arm or actuator so that the top surface faces down, and the chip pads are aligned with the pad surface of the substrate. The bond arm moves to bond the semiconductor devices onto the substrate, and the solder is reflowed to complete the interconnections.

In the flip chip bonding process, control of the tilt angle between the semiconductor devices and the substrate, i.e. bond arm tilt, is critical. In an ideal bonding process as shown in FIG. 1A, a bond arm 100 actuates or displaces a semiconductor device 20 having solder bumps 22 towards a pad surface 32 of a substrate 30, wherein the substrate 30 is disposed on an anvil surface or bonding support surface 200 of an anvil or bonding support 202. The solder bumps 22 can bond evenly with the pad surface 32 and the electrical connections between the semiconductor device 20 and the pad surface 32 are complete. However, in a non-ideal bonding process as shown in FIG. 1B, the solder bumps 22 do not bond evenly with the pad surface 32. Thus, if the bond arm tilt is not properly controlled or an acceptable range of bond arm tilt cannot be achieved, problems such as uneven flatness of the solder bumps 22 as shown in FIG. 1B may occur, increasing the risk of cold joints between the semiconductor device 20 and pad surface 32.

An existing method of controlling bond arm tilt is to manually adjust the orientation of the bond arm 100 relative to the bonding support 202, specifically the bonding support surface 200. The adjustment may be by way of turning the bond arm 100 about the x-axis and y-axis, such that the bond arm 100 points differently towards the bonding support surface 200. After adjustment, the bond arm 100 may be mechanically fastened by screws, and the bond arm tilt can be measured and assessed. Repeated adjustments may be needed until the measured bond arm tilt satisfies, meets, or complies with a predefined specification. Moreover, the predefined specification may be tight and fine adjustment of the bond arm tilt may be required after a tool change, e.g. change of a bond collet.

One problem associated with the existing adjustment method is that the repetitive process of mechanical and manual adjustments followed by the tilting measurement is a qualitative one and is time-consuming. There is also a risk of human errors, e.g. due to mechanical adjustment in the wrong direction or misreading of measurements.

Therefore, in order to address or alleviate at least one of the aforementioned problems and/or disadvantages, there is a need to provide a method and system for automatically aligning a bond arm with respect to a bonding support surface, in which there is at least one improvement and/or advantage over the aforementioned prior art.

SUMMARY

According to a first aspect of the present disclosure, there is a method for automatically aligning a bond arm with respect to a bonding support surface for supporting a substrate during a bonding process. The method comprises: rotating the bond arm for a first revolution around a longitudinal axis through a bond head moveably coupled to the bond arm, the first revolution including a plurality of predefined rotary angular positions; pausing the rotation of the bond arm at each of the plurality of rotary angular positions; determining a tilt angle of the bond arm relative to the bonding support surface during each pause at the respective rotary angular position; and selecting the rotary angular position of the bond arm which has a tilt angle that satisfies a predefined specification such that the bond arm is aligned substantially perpendicular to the bonding support surface.

According to a second aspect of the present disclosure, there is a system for automatically aligning a bond arm with respect to a bonding support surface. The system comprises a bonding apparatus for performing a bonding process, comprising: the bond arm; a bond head moveably coupled to the bond arm; and the bonding support surface for supporting the substrate during the bonding process; and the system further comprises a computing device connected to the bonding apparatus, the computing device comprising a processor and a memory configured to store computer-readable instructions, wherein when the instructions are executed, the processor performs steps comprising: rotating the bond arm for a first revolution around a longitudinal axis through a bond head moveably coupled to the bond arm, the first revolution including a plurality of predefined rotary angular positions; pausing the rotation of the bond arm at each of the plurality of rotary angular positions; determining a tilt angle of the bond arm relative to the bonding support surface during each pause at the respective rotary angular position; and selecting the rotary angular position of the bond arm which has a tilt angle that satisfies a predefined specification such that the bond arm is aligned substantially perpendicular to the bonding support surface.

An advantage of one or more of the above aspects of the present disclosure is that the alignment of the bond arm can be automatically performed with minimal user intervention. This automatic approach to bond arm alignment or adjustment of a misaligned bond arm significantly reduces the time required and the flip chip bonding process can become more efficient. As user intervention is only required if an acceptable range of bond arm tilt cannot be found, the trial-and-error approach of mechanical adjustment such as for every tool change is eliminated or significantly reduced. Another advantage is that substantially even bump flatness can be achieved as the solder bumps can bond evenly with the substrate, and the electrical connections between the semiconductor device and the substrate are complete. Yet another advantage is that the risk of cold joints between the semiconductor device and pad surface during the bonding process is significantly mitigated.

A method and system for automatically aligning a bond arm with respect to a bonding support surface according to the present disclosure are thus disclosed herein. Various features, aspects, and advantages of the present disclosure will become more apparent from the following detailed description of the embodiments of the present disclosure, by way of non-limiting examples only, along with the accompanying drawings in accordance with embodiments of the present disclosure.

BRIEF DESCRIPTION OF THE DRAWINGS

FIG. 5B illustrates a first revolution of the bond arm in the first selection process of FIG. 5A.

FIG. 6A illustrates a side view of the bond arm and reference pin of the bonding apparatus of FIG. 2A.

FIG. 6B illustrates a bottom view of a collet surface of the bond arm of FIG. 6A.

DETAILED DESCRIPTION

In the present disclosure, depiction of a given element or consideration or use of a particular element number in a particular figure or a reference thereto in corresponding descriptive material can encompass the same, an equivalent, or an analogous element or element number identified in another figure or descriptive material associated therewith. The use of "/" in a figure or associated text is understood to mean "and/or" unless otherwise indicated. The recitation of a particular numerical value or value range herein is understood to include or be a recitation of an approximate numerical value or value range. For purposes of brevity and clarity, descriptions of embodiments of the present disclosure are directed to a method and system for automatically aligning a bond arm with respect to a bonding support surface, in accordance with the drawings. It will be appreciated that the drawings may not be drawn to scale and may not be relied on to show or determine particular sizes and/or dimensions.

While aspects of the present disclosure will be described in conjunction with the embodiments provided herein, it will be understood that they are not intended to limit the present disclosure to these embodiments. On the contrary, the present disclosure is intended to cover alternatives, modifications and equivalents to the embodiments described herein, which are included within the scope of the present disclosure as defined by the appended claims. Furthermore, in the following detailed description, specific details are set forth in order to provide a thorough understanding of the present disclosure. However, it will be recognized by an individual having ordinary skill in the art, i.e. a skilled person, that the present disclosure may be practiced without specific details, and/or with multiple details arising from combinations of aspects of particular embodiments. In a number of instances, well-known systems, methods, procedures, and components have not been described in detail so as to not unnecessarily obscure aspects of the embodiments of the present disclosure.

Figure 2A:
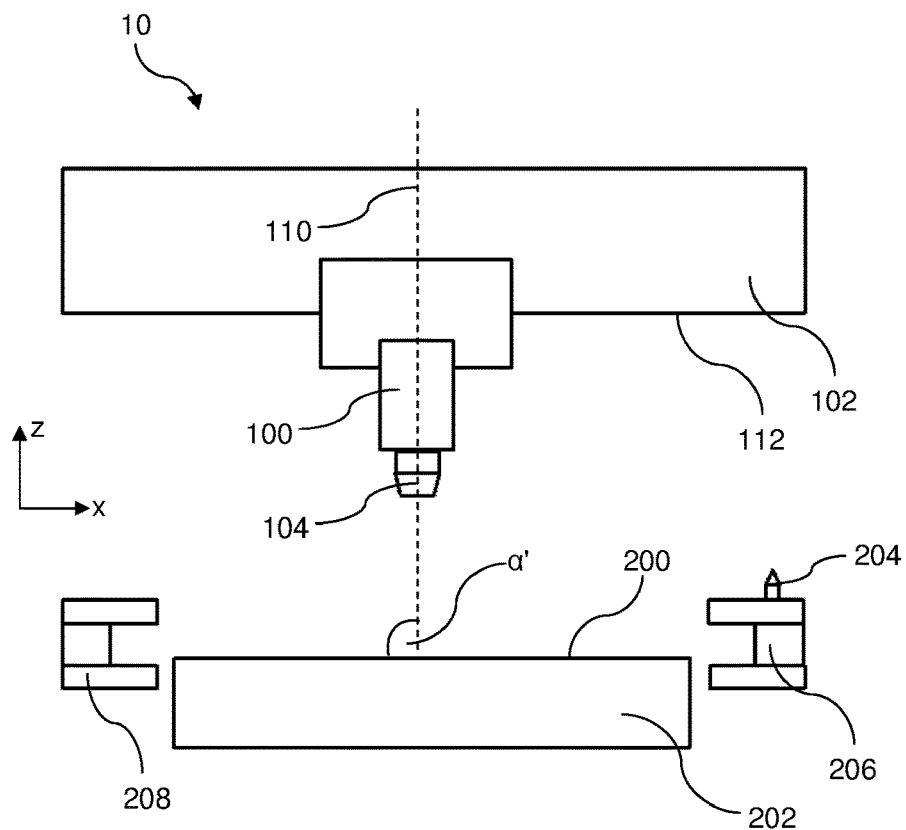
FIG. 2A illustrates a side view of a bonding apparatus.

In representative or exemplary embodiments of the present disclosure, there is a bonding apparatus 10 for performing a flip chip bonding process. Referring to FIG. 2A, the bonding apparatus 10 comprises a bond arm or actuator 100 that is moveably coupled to a bond head 102. A collet 104 is disposed at an end portion of the bond arm 100 for holding semiconductor devices or dies. The bonding apparatus 10 further comprises an anvil or bonding support 202 with an anvil surface or bonding support surface 200 opposing/facing the collet 104. A reference pin 204 is mounted or fixed to a front track 206 of the bonding support 202 for engagement with the collet 104. The reference pin 204 may alternatively or additionally be mounted or fixed to a rear track 208 of the bonding support 202.

Figure 2B:
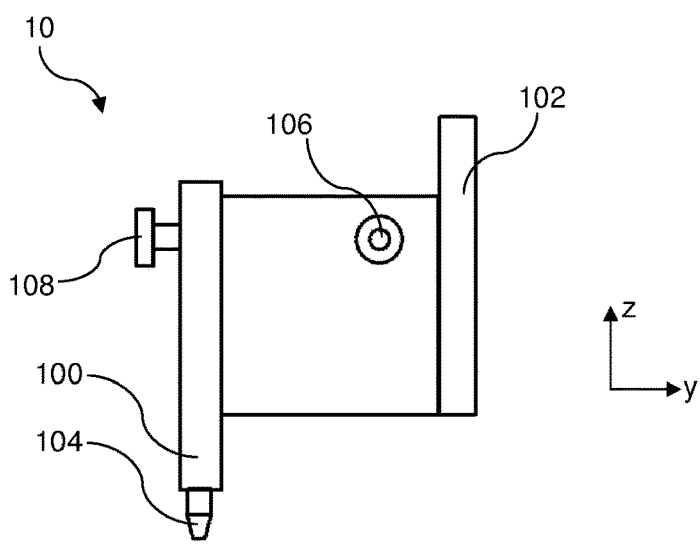
FIG. 2B illustrates a front view of the bonding apparatus of FIG. 2A.

The orientation of a rail guiding the bond arm 100 relative to the bonding support surface 200 may be adjusted by moving the bond head 102. For example, the bond head 102 may be turned or rotated about the y-axis to change the orientation of the rail guiding the bond arm 100, which is pointing towards the bonding support surface 200. Referring to FIG. 2B, the bond arm 100 may be turned or rotated about the y-axis by adjustment, i.e. loosening and tightening of the fastening screw 106. The bond arm 100 may also be turned or rotated about the x-axis by adjustment of the fastening screw 108. Accordingly, the bond arm tilt, i.e. the tilt angle α of the bond arm 100 relative to the bonding support surface 200, may be varied by adjusting the bond arm 100. Ideally, the tilt angle α is zero or 0° such that the angle α' between the bond arm 100 and the bonding support surface 200 is exactly 90°, wherein α'=90°−α.

Figure 3A:
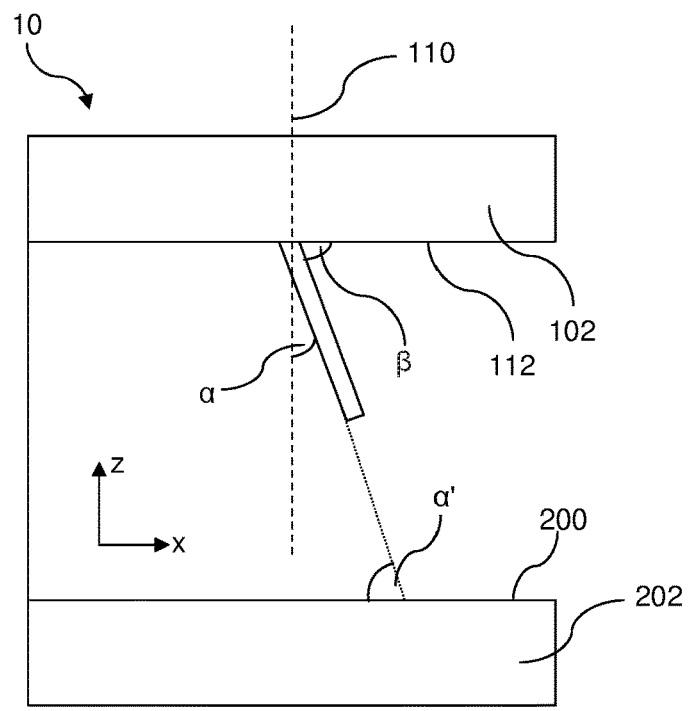
FIG. 3A illustrates a schematic of a bond arm of the bonding apparatus of FIG. 2A with an exaggerated bond arm tilt.
Figure 3B:
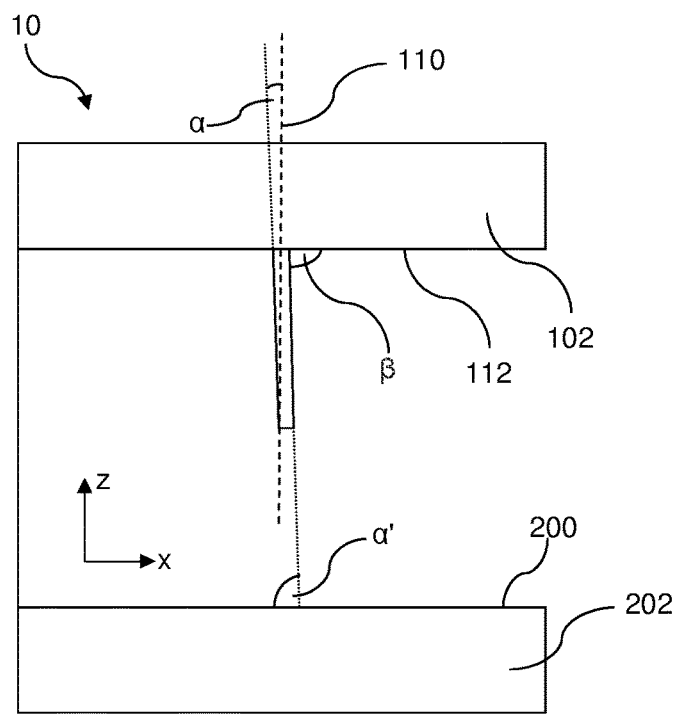
FIG. 3B illustrates a schematic of the bond arm of FIG. 3A which has been aligned by rotation around a longitudinal axis.

In some embodiments, the bond arm 100 may not be perpendicular to the bond head 102, i.e. the joint angle β between the bond arm 100 and the bond head 102 may not be exactly 90°. For example, FIG. 3A and FIG. 3B schematically illustrates various exaggerated bond arm tilts of the bond arm 100 relative to the bonding support surface 200, and subsequent alignment of the bond arm 100 relative to the bonding support surface 200, respectively. The lower surface 112 of the bond head 102 is parallel to the bonding support surface 200 but the joint angle β is not at 90° to it. There is a longitudinal axis 110 that is perpendicular to and passes through the lower surface 112, specifically at the joint or coupling between the bond arm 100 and bond head 102. The bond arm 100 may be rotated around the longitudinal axis 110 to change the direction of the bond arm 100 pointing towards the bonding support surface 200, such as shown in FIG. 3B wherein the joint angle β is closer to 90° and the tilt angle α is closer to 0°.

Figure 4A:
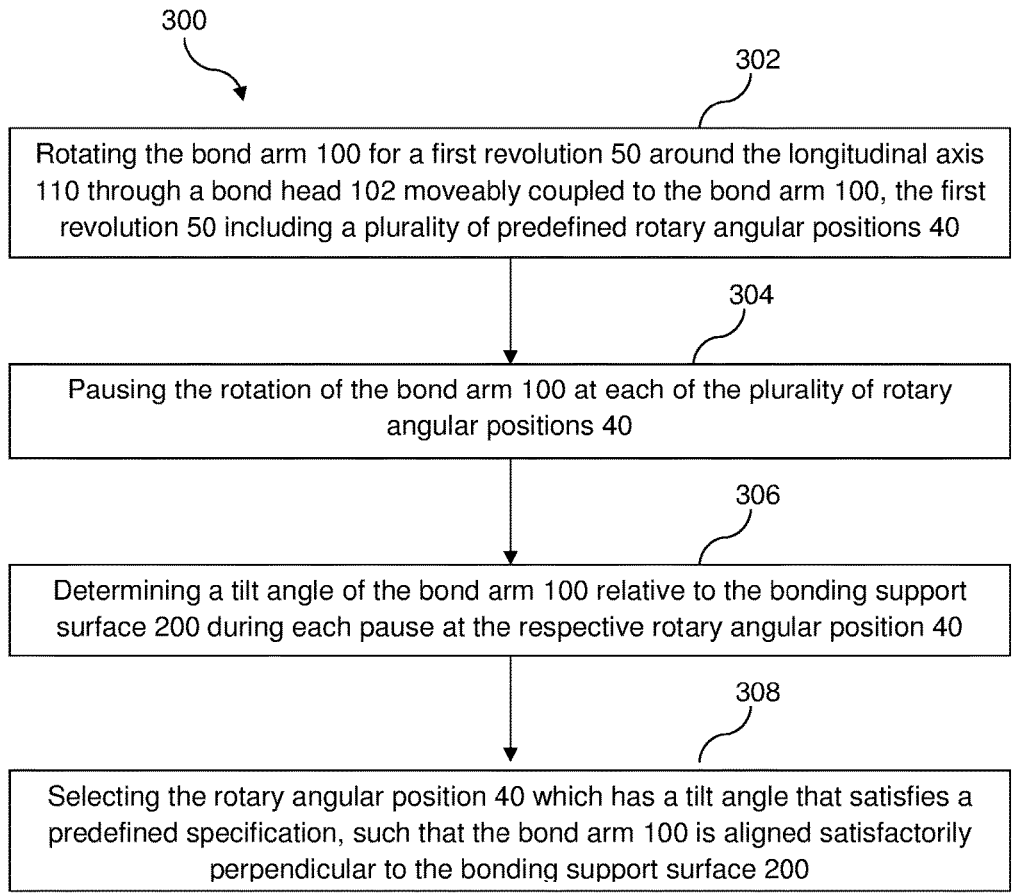
FIG. 4A illustrates a flowchart of a method for automatically aligning a bond arm with respect to a bonding support surface.
Figure 4B:
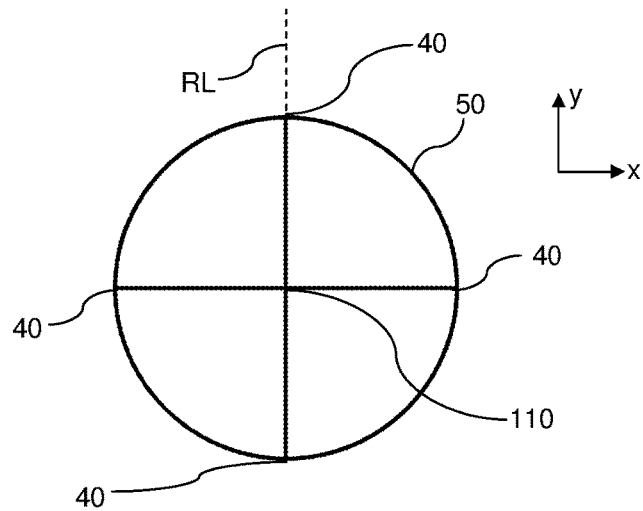
FIG. 4B illustrates a revolution of a bond arm in the method of FIG. 4A.

The bond arm 100 is thus rotatable around the longitudinal axis 110 through a plurality of rotary angular positions. Some of these rotary angular positions may result in the tilt angle α being closer to 0° than other rotary angular positions. In various embodiments with reference to the flowchart in FIG. 4A and the rotational path or revolution 50 of the bond arm 100 in FIG. 4B, there is a method 300 for automatically aligning the bond arm 100 with respect to the bonding support surface 200 for supporting a substrate 30 during a bonding process. Broadly, the method 300 comprises:

a. a step 302 of rotating the bond arm 100 for a first revolution 50 around the longitudinal axis 110 through a bond head 102 moveably coupled to the bond arm 100, the first revolution 50 including a plurality of predefined rotary angular positions 40;

b. a step 304 of pausing the rotation of the bond arm 100 at each of the plurality of rotary angular positions 40;

c. a step 306 of determining a tilt angle of the bond arm 100 relative to the bonding support surface 200 during each pause at the respective rotary angular position 40; and d. a step 308 of selecting the rotary angular position 40 which has a tilt angle that satisfies a predefined specification, such that the bond arm 100 is aligned substantially perpendicular to the bonding support surface 200.

If the bond arm 100 is misaligned with respect to the bonding support surface 200, the method 300 is performed to align or adjust the bond arm 100 until the bond arm 100 is aligned substantially perpendicular to the bonding support surface 200. The alignment of the bond arm 100 with respect to the bonding support surface 200 is considered to be substantially perpendicular if the bond arm 100 is rotated to the selected rotary angular position 40 which has a tilt angle that satisfies the predefined specification. It will be appreciated that, at the selected rotary angular position 40, the bond arm 100 may not be aligned exactly perpendicular to the bonding support surface 200.

The bond arm 100 may be manually adjusted until the lower surface 112 is as parallel to the bonding support surface 200 as possible before performing the method 300, but human dexterity and/or manufacturing defects may limit the degree of parallelism, thereby affecting the tilt angle α of the bond arm 100 relative to the bonding support surface 200. The rotation of the bond arm 100 may be driven by a servomotor or stepper motor or any other mechanism known to the skilled person. The rotary angular positions 40 are predefined and distributed across the first revolution 50, i.e. a 360° rotation. The rotary angular positions 40 are preferably evenly distributed such that the intervals between every pair of consecutive rotary angular positions 40 are the same. It will be appreciated that the number of predefined rotary angular positions 40 for the first revolution 50 may be different and not evenly distributed with equal intervals. Further, the angular separations between any pair of consecutive rotary angular positions 40 may also be different, e.g. 90° or 22.5°, and unequal for every distinct pair. The number of iterations of the tilt angle calculation process in the step 306 corresponds to the number of rotary angular positions 40.

First Selection Process 400

Figure 5A:
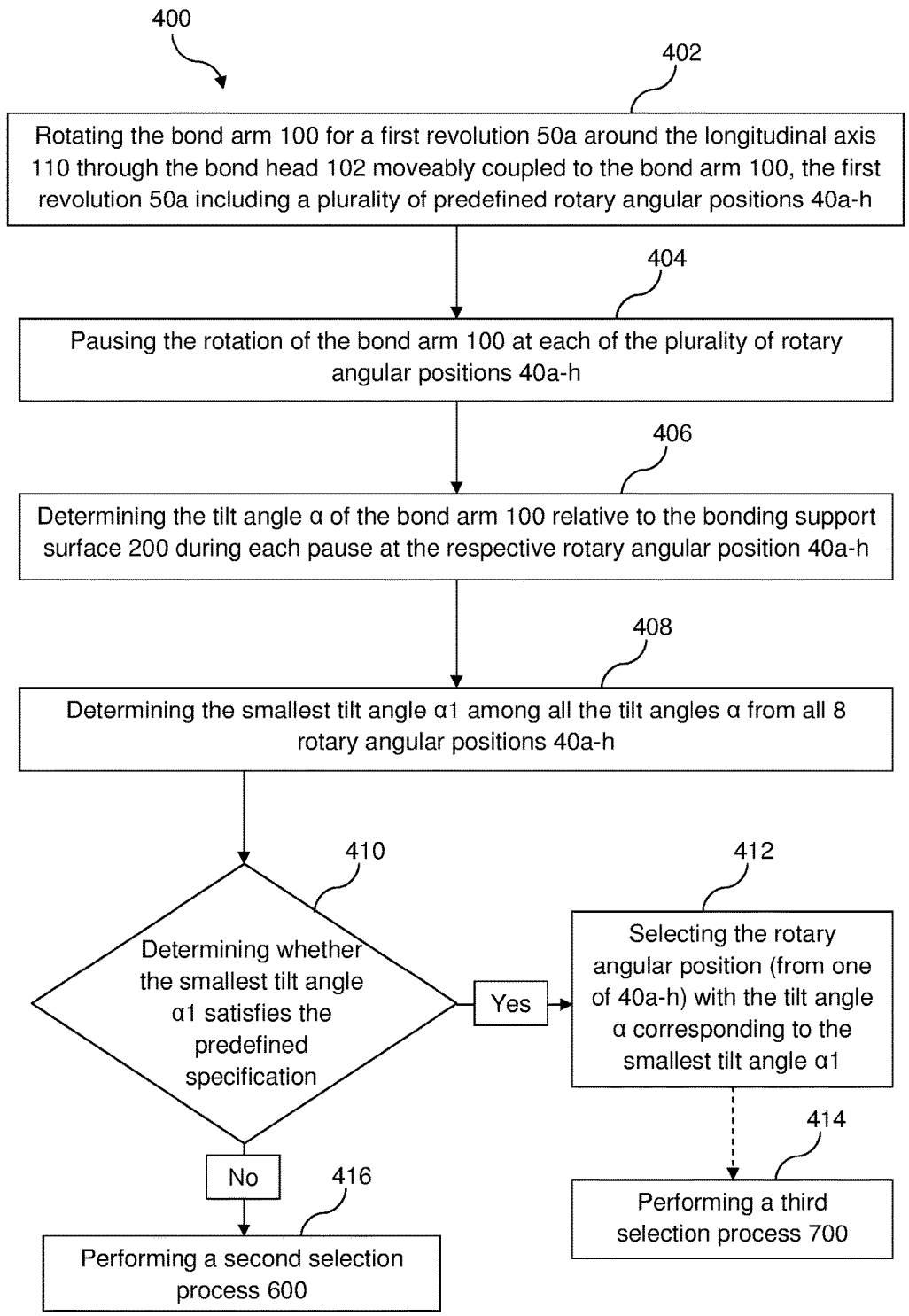
FIG. 5A illustrates a flowchart of a first selection process of the method of FIG. 4A.

An embodiment of the method 300 is described with reference to FIG. 5A and FIG. 5B. The method 300 comprises a first selection process 400 for automatically aligning the bond arm 100 with respect to the bonding support surface 200. The first selection process 400 comprises a step 402 of rotating the bond arm 100 for a first revolution 50a around the longitudinal axis 110 through the bond head 102 moveably coupled to the bond arm 100, the first revolution 50a including a plurality of predefined rotary angular positions 40. The first revolution 50a of 360° is demarcated into 8 rotary angular positions 40a-h, such that every pair of consecutive rotary angular positions 40a-h, e.g. between 40a and 40b or between 40b and 40c, are 45° apart. Table 1 below illustrates the 8 rotary angular positions 40a-h and the respective angular separations from the reference line RL with reference to FIG. 4B and FIG. 5B.

TABLE 1

Rotary Angular Positions in First Selection Process 400

| Rotary Angular Position | Angular Separation from Reference Line RL |
| --- | --- |
| 40a | 0°/360° |
| 40b | 45° |
| 40c | 90° |
| 40d | 135° |
| 40e | 180° |
| 40f | 225° |
| 40g | 270° |
| 40h | 315° |

The first selection process 400 further comprises a step 404 of pausing the rotation of the bond arm 100 at each of the plurality of rotary angular positions 40a-h, and a step 406 of determining the tilt angle α of the bond arm 100 relative to the bonding support surface 200 during each pause at the respective rotary angular position 40a-h. Particularly, in the step 406, the tilt angles α are determined from a tilt angle calculation process 500. In the first revolution 50a, the bond arm 100 rotates through the 8 rotary angular positions 40a-h. At each of the rotary angular positions 40a-h, the rotation is paused or temporarily stopped for performing the tilt angle calculation process 500.

Although the bond arm 100 remains stationary immediately before the rotation begins and immediately after the rotation ends, these stationary positions of the bond arm 100 may be construed as pauses in the step 404. The tilt angle calculation process 500 may be performed first at the rotary angular position 40a corresponding to the angular separation of 0° at the first pause immediately before the rotation begins, i.e. before the other 7 rotary angular positions 40b-h. Alternatively, the tilt angle calculation process 500 may be performed last at the rotary angular position 40a corresponding to the angular separation of 360° at the last pause immediately after the rotation ends, i.e. after the other 7 rotary angular positions 40b-h.

Tilt Angle Calculation Process 500

Referring to FIG. 6A and FIG. 6B, the tilt angle calculation process 500 broadly comprises probing heights of three or more distinct points 114 on the bond arm 100 with the reference pin 204 arranged perpendicular to the bonding support surface 200. Particularly, the three or more distinct points 114 are predefined on a collet surface 116 of the collet 104 disposed at the end portion of the bond arm 100. It will be appreciated that at least three distinct points 114 are required in order to define a plane on the collet surface 116. Preferably, the three or more distinct points 114 are located at a peripheral region 118 of the collet surface 116 used to contact and hold a semiconductor device 20. Also, more distinct points 114 on the collet surface 116 will make the plane definition more accurate in case of deviations on the collet surface 116.

The tilt angle calculation process 500 further comprises actuating or displacing the bond arm 100 relative to the reference pin 204, such that the reference pin 204 engages each of the three or more distinct points 114 on the collet surface 116. The tilt angle calculation process 500 further comprises calculating a planar inclination of the collet surface 116 relative to the bonding support surface 200 based on the probed heights of the three or more distinct points 114 on the collet surface 116. Ideally, the probed heights of all the three or more distinct points 114 are the same, such that the collet surface 116 is perpendicular to the reference pin 204 and parallel to the bonding support surface 200. There would be zero planar inclination of the collet surface 116 relative to the bonding support surface 200. However, if at least one distinct point 114 has a different probed height than the others, the planar inclination would not be zero.

Figure 6C:
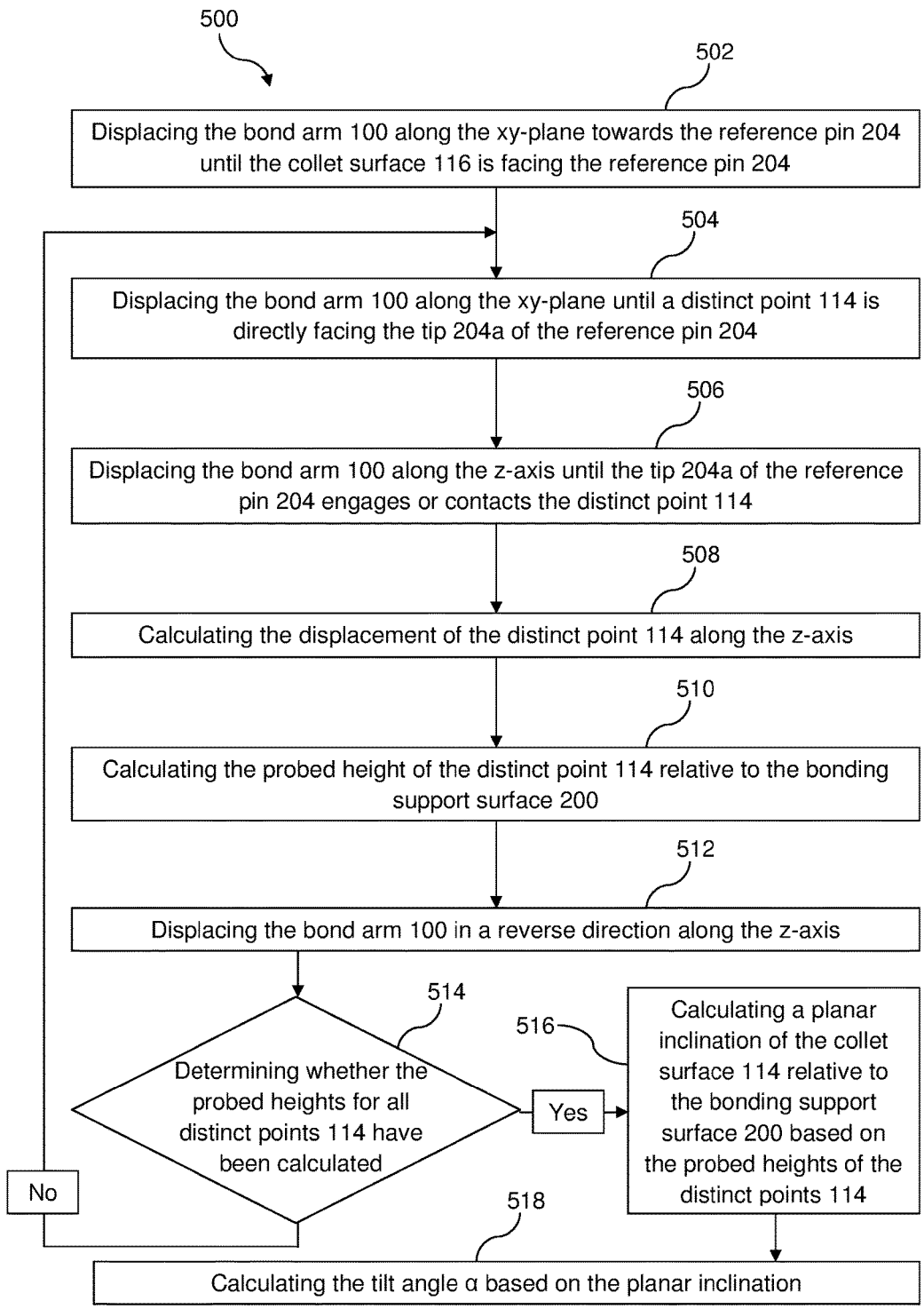
FIG. 6C illustrates a flowchart of determining a tilt angle of the bond arm relative to the bonding support surface from the method of FIG. 4A.

An embodiment of the tilt angle calculation process 500 is described with additional reference to FIG. 6C. As shown in FIG. 6B, there are 4 distinct points 114a-d predefined on the collet surface 116. The tilt angle calculation process 500 comprises a step 502 of displacing the bond arm 100 along the xy-plane towards the reference pin 204 until the collet surface 116 is facing, e.g. directly above, the reference pin 204. The tilt angle calculation process 500 further comprises a step 504 displacing the bond arm 100 along the xy-plane until the first distinct point 114a is directly facing the tip 204a of the reference pin 204. The tilt angle calculation process 500 further comprises a step 506 of displacing the bond arm 100 along the z-axis until the tip 204a of the reference pin 204 engages or contacts the first distinct point 114a. The displacement of the first distinct point 114a along the z-axis, i.e. the distance moved by the first distinct point 114a along the z-axis towards the tip 204a of the reference pin 204, is calculated in a step 508, e.g. by a computing device connected to the bonding apparatus 10. In a subsequent step 510, the probed height of the first distinct point 114a relative to the bonding support surface 200 is calculated from the displacement of the first distinct point 114a along the z-axis as the height of the reference pin 204 is known. The tilt angle calculation process 500 further comprises a step 512 of displacing the bond arm 100 in a reverse direction along the z-axis for the same displacement calculated in the step 508.

The tilt angle calculation process 500 further comprises a step 514 of determining whether the probed heights for all 4 distinct points 114a-d have been calculated. If no, the step 514 proceeds to repeat the steps 504, 506, 508, and 510 for each of the remaining distinct points 114a-d. In this example, the steps 504, 506, 508, and 510 are repeated for the remaining three distinct points 114b-d.

After all the probed heights for all 4 distinct points 114a-d have been calculated, the step 514 proceeds to a step 516 of calculating a planar inclination of the collet surface 114 relative to the bonding support surface 200 based on the probed heights of the 4 distinct points 114a-d. The tilt angle α can be calculated in a subsequent step 518 based on the planar inclination. Ideally, the planar inclination of the collet surface 116 and the tilt angle α of the bond arm 100 relative to the bonding support surface 200 is zero. The step tilt angle calculation process 500 thus calculates the planar inclination of the collet surface 116 and the tilt angle α for each of the rotary angular positions 40a-h.

After performing the tilt angle calculation process 500 for all 8 rotary angular positions 40a-h, the step 406 proceeds to a step 408 of determining the smallest tilt angle α1 among all the tilt angles α from all 8 rotary angular positions 40a-h. The first selection process 400 further comprises a step 410 of determining whether the smallest tilt angle α1 satisfies the predefined specification. The predefined specification provides a limit to an allowable planar inclination of the collet surface 116 relative to the bonding support surface 200. For example, the predefined specification may be 1 µm/mm, which is translated to mean a vertical displacement of 1 µm for every 1 mm of horizontal displacement. In angular terms, the predefined specification of 1 µm/mm corresponds to an angle of 0.001 radians or 0.0573°. It will be appreciated that the predefined specification may vary such as depending on operational constraints or requirements of the bonding apparatus 10 and/or bonding process.

The smallest tilt angle α1 would satisfy, meet, or comply with the predefined specification, e.g. 1 µm/mm or 0.0573°, if the value of α1 is not above 0.0573°. If the smallest tilt angle α1 satisfies the predefined specification, the step 410 proceeds to a step 412 of selecting the rotary angular position (from one of 40a-h) with the tilt angle α corresponding to the smallest tilt angle α1. At this selected rotary angular position, the bond arm 100 is substantially perpendicular to the bonding support surface 200 such that the predefined specification is satisfied. The first selection process 400 may end after the step 412 and the selected rotary angular position will be used for the bonding process. Optionally, the step 412 may proceed to a step 414 of performing a third selection process 700 on the selected rotary angular position.

Conversely, if the smallest tilt angle α1 does not satisfy the predefined specification, which also means that none of the tilt angles α from all 8 rotary angular positions 40a-h satisfies the predefined specification. A suitable rotary angular position (from one of 40a-h) for the bonding process cannot be found from the first selection process 400. The step 410 may proceed to a step 416 of performing a second selection process 600. Alternatively, instead of the second selection process 600, the third selection process 700 may be performed on the rotary angular position (one of 40a-h) with the tilt angle α corresponding to the smallest tilt angle α1 even though the tilt angle α does not satisfy the predefined specification.

Second Selection Process 600

Figure 7A:
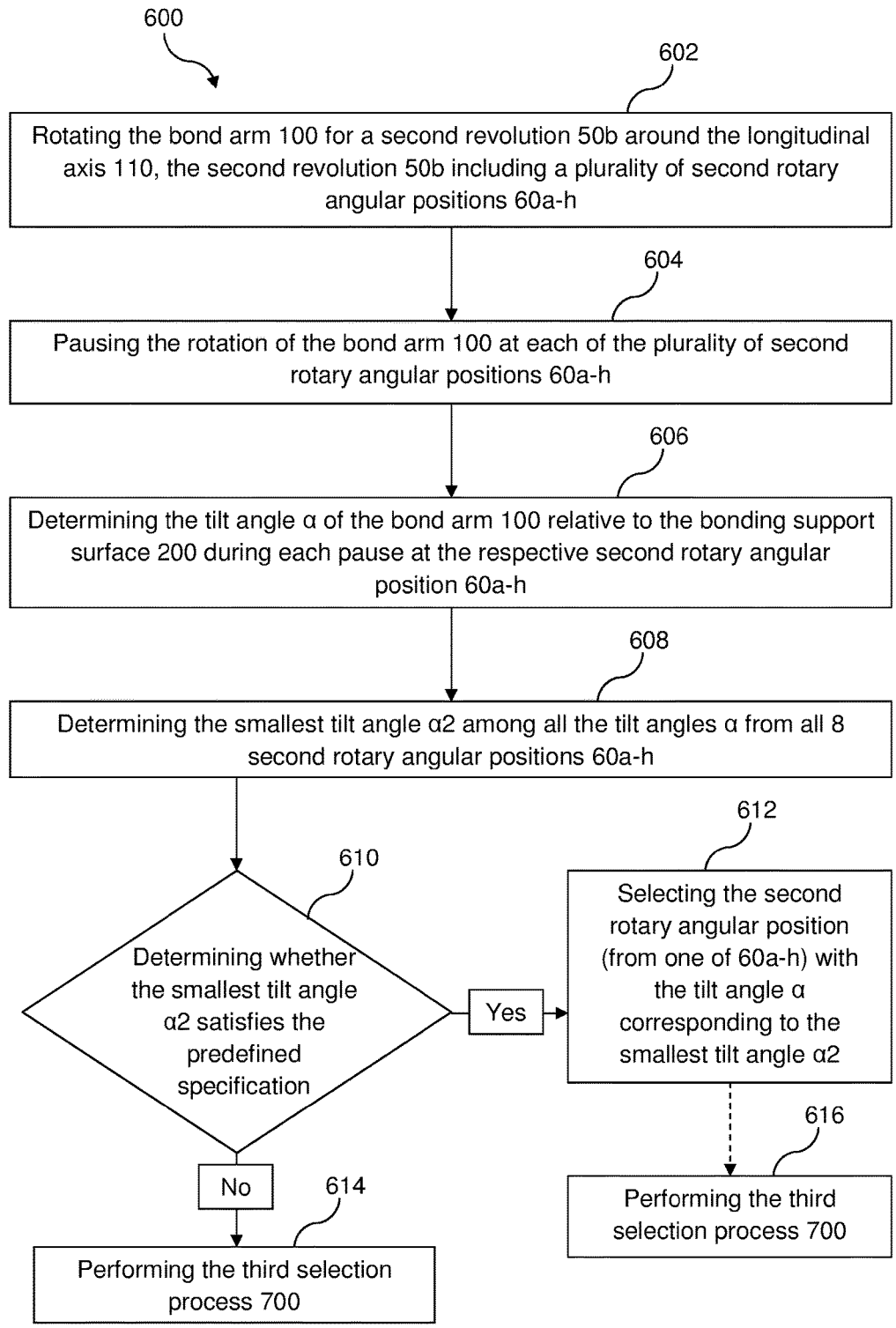
FIG. 7A illustrates a flowchart of a second selection process of the method of FIG. 4A.
Figure 7B:
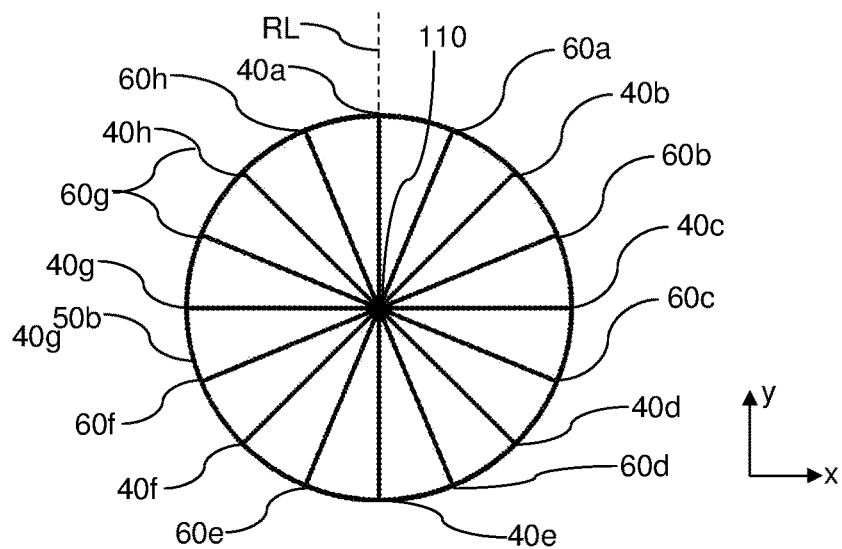
FIG. 7B illustrates a second revolution of the bond arm in the second selection process of FIG. 7A.

The second selection process 600 is described with reference to FIG. 7A and FIG. 7B. The second selection process 600 comprises a step 602 of rotating the bond arm 100 for a second revolution 50b around the longitudinal axis 110, the second revolution 50b including a plurality of second rotary angular positions 60 that are different from the predefined rotary angular positions 40 of the first revolution 50a (also referred to as first rotary angular positions 40). The second rotary angular positions 60 are defined and distributed across the second revolution 50b, i.e. a 360° rotation, without coinciding with any of the first rotary angular positions 40. Particularly, each second rotary angular position 60 is substantially in-between or bisects a pair of consecutive first rotary angular positions 40. As shown in FIG. 7B, the second revolution 50b of 360° is demarcated into 8 second rotary angular positions 60a-h, such that every pair of consecutive second rotary angular positions 60, e.g. between 60a and 60b or between 60b and 60c, are 45° apart. Table 2 below illustrates the 8 second rotary angular positions 60a-h and the respective angular separations from the reference line RL with reference to FIG. 7B.

TABLE 2

Second Rotary Angular Positions in Second Selection Process 600

| Second Rotary Angular Position | Angular Separation from Reference Line RL |
| --- | --- |
| 60a | 22.5° |
| 60b | 67.5° |
| 60c | 112.5° |
| 60d | 157.5° |
| 60e | 202.5° |
| 60f | 247.5° |
| 60g | 292.5° |
| 60h | 337.5° |

Similarly, it will be appreciated that the second rotary angular positions 60 may be evenly distributed such that the intervals between every pair of consecutive second rotary angular positions 60 are the same. It will also be appreciated that the number of predefined second rotary angular positions 60 for the second revolution 50b may be different, e.g. 4 or 16, and not evenly distributed with equal intervals. Further, the angular separations between any pair of consecutive second rotary angular positions 60 may also be different, e.g. 90° or 22.5°, and unequal for every distinct pair.

The second selection process 600 further comprises a step 604 of pausing the rotation of the bond arm 100 at each of the plurality of second rotary angular positions 60a-h, and a step 606 of determining the tilt angle α of the bond arm 100 relative to the bonding support surface 200 during each pause at the respective second rotary angular position 60a-h. Particularly, in the step 606, the tilt angles α are determined from the tilt angle calculation process 500.

After performing the tilt angle calculation process 500 for all 8 second rotary angular positions 60a-h, the second selection process 600 proceeds to a step 608 of determining the smallest tilt angle α2 among all the tilt angles α from all 8 second rotary angular positions 60a-h. The second selection process 600 further comprises a step 610 of determining whether the smallest tilt angle α2 satisfies the predefined specification.

If the smallest tilt angle α2 satisfies the predefined specification, the step 610 proceeds to a step 612 of selecting the second rotary angular position (from one of 60a-h) with the tilt angle α corresponding to the smallest tilt angle α2. At this selected rotary angular position, the bond arm 100 is substantially perpendicular to the bonding support surface 200 such that the predefined specification is satisfied. The second selection process 600 may end after the step 612 and the selected rotary angular position will be used for the bonding process. Optionally, the step 612 may proceed to a step 614 of performing the third selection process 700 on the selected rotary angular position.

Conversely, if the smallest tilt angle α2 does not satisfy the predefined specification, which also means that none of the tilt angles α from all 8 second rotary angular positions 60a-h satisfies the predefined specification. A suitable rotary angular position (from one of 40a-h and 60a-h) for the bonding process cannot be found from the first selection process 400 and second selection process 600. The step 610 may proceed to a step 616 of performing the third selection process 700 on the rotary angular position (one of 60a-h) with the tilt angle α corresponding to the smallest tilt angle α2, even though the tilt angle α does not satisfy the predefined specification. It will be appreciated that if α1 (from the first selection process 400) is smaller than α2 (from the second selection process 600), the third selection process 700 may instead be performed on the rotary angular position with the tilt angle α corresponding to the smallest tilt angle α1, i.e. one of the first rotary angular positions 40a-h from the first selection process 400.

Third Selection Process 700

Figure 8A:
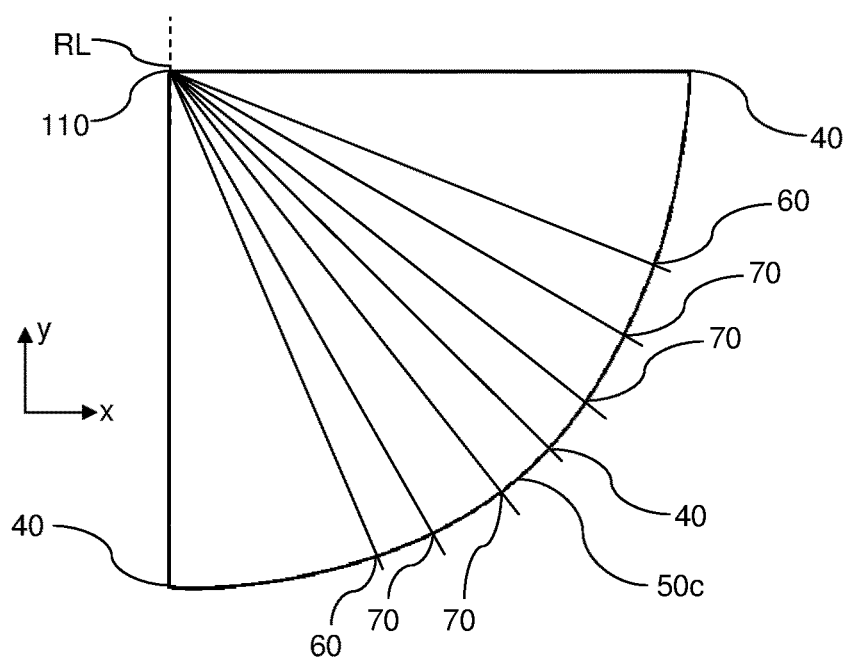
FIG. 8A illustrates a partial revolution of the bond arm of the method of FIG. 4A.

The third selection process 700 is described with reference to FIG. 8A. As mentioned above, the third selection process 700 may be optionally performed in the first selection process 400 and/or the second selection process 600, or performed after the second selection process 600 if a suitable rotary angular position cannot be found. The third selection process 700 seeks to find a more suitable rotary angular position and may also be referred to as a fine-tuning process. Broadly, the third selection process 700 comprises rotating the bond arm 100 across a plurality of third rotary angular positions 70 that are closer together within a rotary angular range that includes the selected rotary angular position 40/60. As the third rotary angular positions 70 are closer together, they may also be referred to as finer rotary angular positions 70. Further, the selected rotary angular position 40/60 may be referred to as the previously-selected rotary angular position 40/60, i.e. previously selected from the first selection process 400 or second selection process 600. The third selection process 700 may optionally be performed if an optimal rotary angular position cannot be found after the first selection process 400 and second selection process 600. The rotary angular position 40/60 with the smallest tilt angle α may be determined as a chosen rotary angular position for the third selection process 700. The rotary angular range and the plurality of third rotary angular positions 70 thereof reside along a rotational path or partial revolution 50c around the longitudinal axis 110.

The third selection process 700 further comprises of determining the tilt angle α of the bond arm 100 relative to the bonding support surface 200 during each pause at the respective third rotary angular position 70. Particularly, the tilt angles α are determined from the tilt angle calculation process 500. If one of the third rotary angular positions 70 has a smaller tilt angle α than the tilt angle α of the previously-selected rotary angular position 40/60, the third selection process 700 replaces the previously-selected rotary angular position 40/60 with one of the third rotary angular positions 70. Accordingly, one of the third rotary angular positions 70 then becomes the selected rotary angular position 70. Otherwise, the third selection process 700 retains the previously-selected rotary angular position 40/60.

Figure 8B:
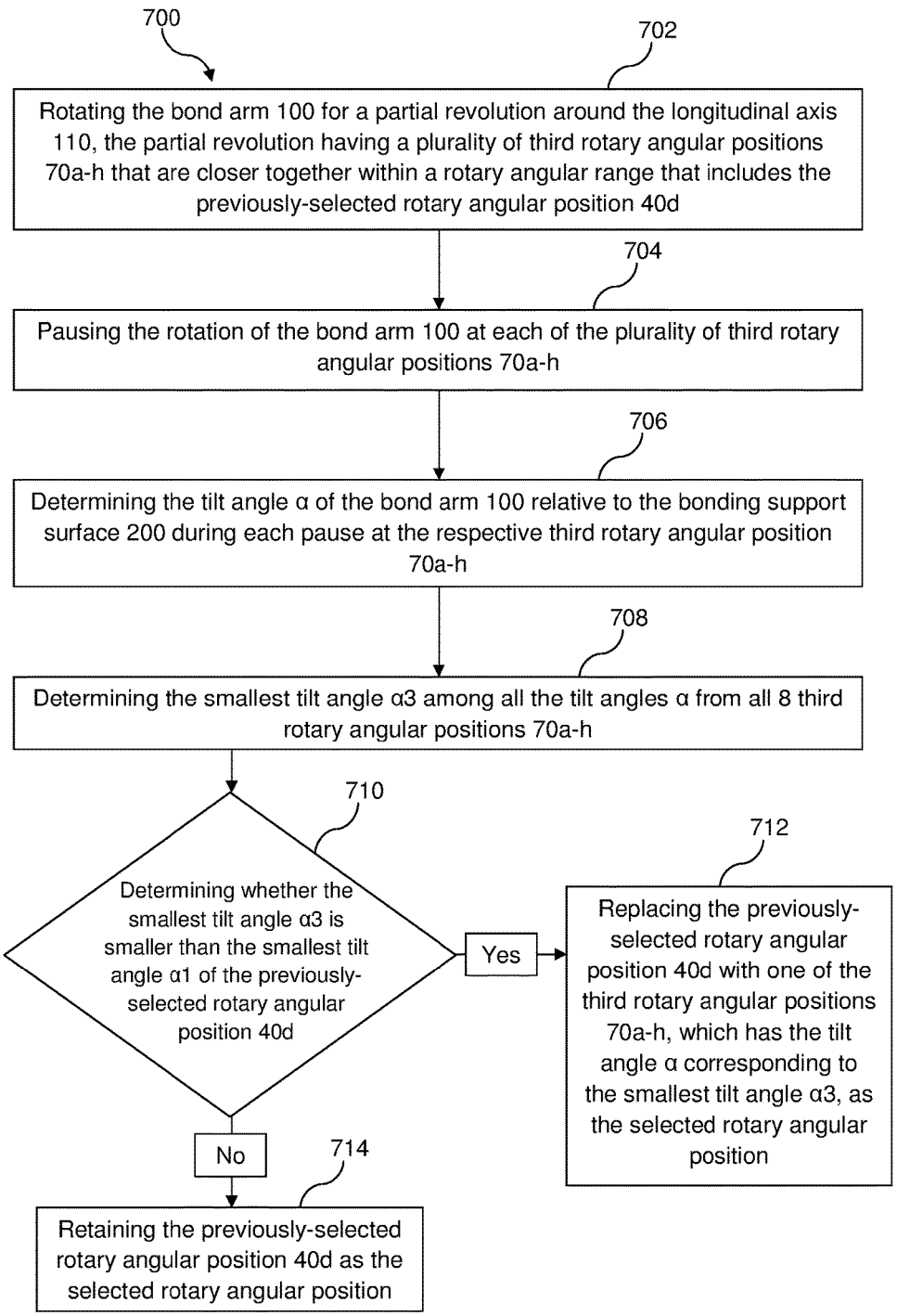
FIG. 8B illustrates a flowchart of a third selection process after the first selection process of FIG. 5A.

Referring to FIG. 8B, in a first example of the third selection process 700 performed in the step 414, the previously-selected rotary angular position 40d (135° from the reference line RL) has a tilt angle α corresponding to the smallest tilt angle α1 that satisfies the predefined specification. Beginning from the previously-selected rotary angular position 40d, the third selection process 700 comprises a step 702 of rotating the bond arm 100 for a partial revolution around the longitudinal axis 110, the partial revolution including a plurality of third rotary angular positions 70 that are closer together within a rotary angular range that includes the previously-selected rotary angular position 40d.

It will be appreciated that the previously-selected rotary angular position 40d is substantially in-between or bisects the rotary angular range and the rotary angular range does not extend towards the vicinity of the adjacent rotary angular positions 40c and 40e. It will also be appreciated that as the rotary angular positions 40 for the first revolution 50a are at 45° intervals, the rotary angular range may be ±20° from the previously-selected rotary angular position 40d, i.e. from 115 to 155° relative to the reference line RL.

The rotary angular range may be demarcated into intervals that are finer or smaller than the intervals for the first revolution 50a. For example, the rotary angular range may be demarcated into 5° intervals, resulting in 8 third or finer rotary angular positions 70a-h (excluding the previously-selected rotary angular position 40d). Table 3 below illustrates the 8 third rotary angular positions 70a-h and the respective angular separations from the reference line RL.

TABLE 3

Third Rotary Angular Positions in Third Selection Process 700 after First Selection Process 400

| Third Rotary Angular Position | Angular Separation from Reference Line RL |
|---|---|
| 70a | 115° |
| 70b | 120° |
| 70c | 125° |
| 70d | 130° |
| 70e | 140° |
| 70f | 145° |
| 70g | 150° |
| 70h | 155° |

The third selection process 700 further comprises a step 704 of pausing the rotation of the bond arm 100 at each of the plurality of third rotary angular positions 70a-h, and a step 706 of determining the tilt angle α of the bond arm 100 relative to the bonding support surface 200 during each pause at the respective third rotary angular position 70a-h. Particularly, in the step 706, the tilt angles α are determined from the tilt angle calculation process 500.

After performing the tilt angle calculation process 500 for all 8 third rotary angular positions 70a-h, the third selection process 700 proceeds to a step 708 of determining the smallest tilt angle α3 among all the tilt angles α from all 8 third rotary angular positions 70a-h. The third selection process 700 further comprises a step 710 of determining whether the smallest tilt angle α3 is smaller than the smallest tilt angle α1 of the previously-selected rotary angular position 40d. If yes, the step 710 proceeds to a step 712 of replacing the previously-selected rotary angular position 40d with one of the third rotary angular positions 70a-h, which has the tilt angle α corresponding to the smallest tilt angle α3, as the selected rotary angular position. It will be appreciated that if α1 satisfies the predefined specification, then α3 which is smaller than α1 also satisfies the predefined specification. Thus, at this selected rotary angular position (one of 70a-h), the bond arm 100 is also aligned substantially perpendicular to the bonding support surface 200.

Conversely, if the step 710 determines that the smallest tilt angle α3 is not smaller than the smallest tilt angle α1 of the previously-selected rotary angular position 40d, then the step 710 proceeds to a step 714 of retaining the previously-selected rotary angular position 40d as the selected rotary angular position.

Figure 8C:
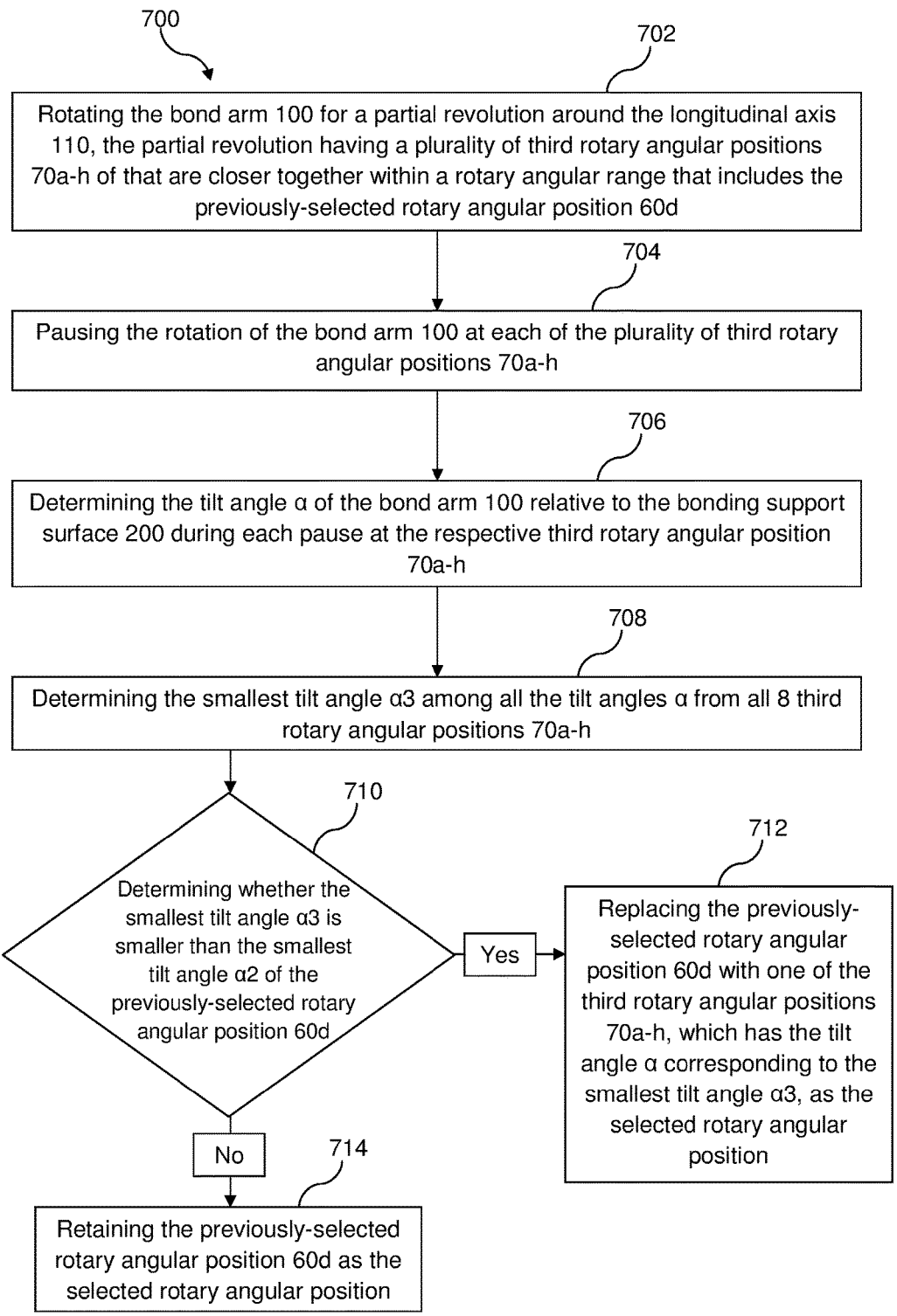
FIG. 8C illustrates a flowchart of a third selection process after the second selection process of FIG. 7A.

Referring to FIG. 8C, in a second example of the third selection process 700 performed in the step 614, the previously-selected rotary angular position 60d (157.5° from the reference line RL) has a tilt angle α corresponding to the smallest tilt angle α2 that satisfies the predefined specification. Beginning from the previously-selected rotary angular position 60d, the third selection process 700 comprises a step 702 of rotating the bond arm 100 for a partial revolution around the longitudinal axis 110, the partial revolution including a plurality of third rotary angular positions 70a-h that are closer together within a rotary angular range that includes the previously-selected rotary angular position 60d.

It will be appreciated that the previously-selected rotary angular position 60d is substantially in between or bisects the rotary angular range and the rotary angular range does not extend towards the vicinity of the adjacent rotary angular positions 60c and 60e. However, as the previously-selected rotary angular position 60d is a result of the second selection process 600 which is performed after the first selection process 400, the rotary angular range additionally should not extend towards the vicinity of the nearest first rotary angular positions, specifically 40d (135° from the reference line RL) and 40e (180° from the reference line RL).

As such, the rotary angular range for this second example is narrower than for the first example, such as ±10° from the previously-selected rotary angular position 60d, i.e. from 147.5 to 167.5° relative to the reference line RL. The rotary angular range may be demarcated into intervals that are finer or smaller than the intervals for the first example. The rotary angular range may be demarcated into 2.5° intervals, resulting in 8 third or finer rotary angular positions 70a-h (excluding the previously-selected rotary angular position 60d). Table 4 below illustrates the 8 third rotary angular positions 70a-h and the respective angular separations from the reference line RL.

TABLE 4

Third Rotary Angular Positions in Third Selection Process 700 after Second Selection Process 600

| Third Rotary Angular Position | Angular Separation from Reference Line RL |
|---|---|
| 70a | 147.5° |
| 70b | 150° |
| 70c | 152.5° |
| 70d | 155° |
| 70e | 160° |
| 70f | 162.5° |
| 70g | 165° |
| 70h | 167.5° |

The third selection process 700 further comprises a step 704 of pausing the rotation of the bond arm 100 at each of the plurality of third rotary angular positions 70a-h, and a step 706 of determining the tilt angle α of the bond arm 100 relative to the bonding support surface 200 during each pause at the respective third rotary angular position 70a-h. Particularly, in the step 706, the tilt angles α are determined from the tilt angle calculation process 500.

After performing the tilt angle calculation process 500 for all 8 third rotary angular positions 70a-h, the third selection process 700 proceeds to a step 708 of determining the smallest tilt angle α3 among all the tilt angles α from all 8 third rotary angular positions 70a-h. The third selection process 700 further comprises a step 710 of determining whether the smallest tilt angle α3 is smaller than the smallest tilt angle α2 of the previously-selected rotary angular position 60d. If yes, the step 710 proceeds to a step 712 of replacing the previously-selected rotary angular position 60d with one of the third rotary angular positions 70a-h, which has the tilt angle α corresponding to the smallest tilt angle α3, as the selected rotary angular position. It will be appreciated that if α2 satisfies the predefined specification, then α3 which is smaller than α2 also satisfies the predefined specification. Thus, at this selected rotary angular position (one of 70a-h), the bond arm 100 is also aligned substantially perpendicular to the bonding support surface 200.

Conversely, if the step 710 determines that the smallest tilt angle α3 is not smaller than the smallest tilt angle α2 of the previously-selected rotary angular position 60d, then the step 710 proceeds to a step 714 of retaining the previously-selected rotary angular position 60d as the selected rotary angular position.

Figure 8D:
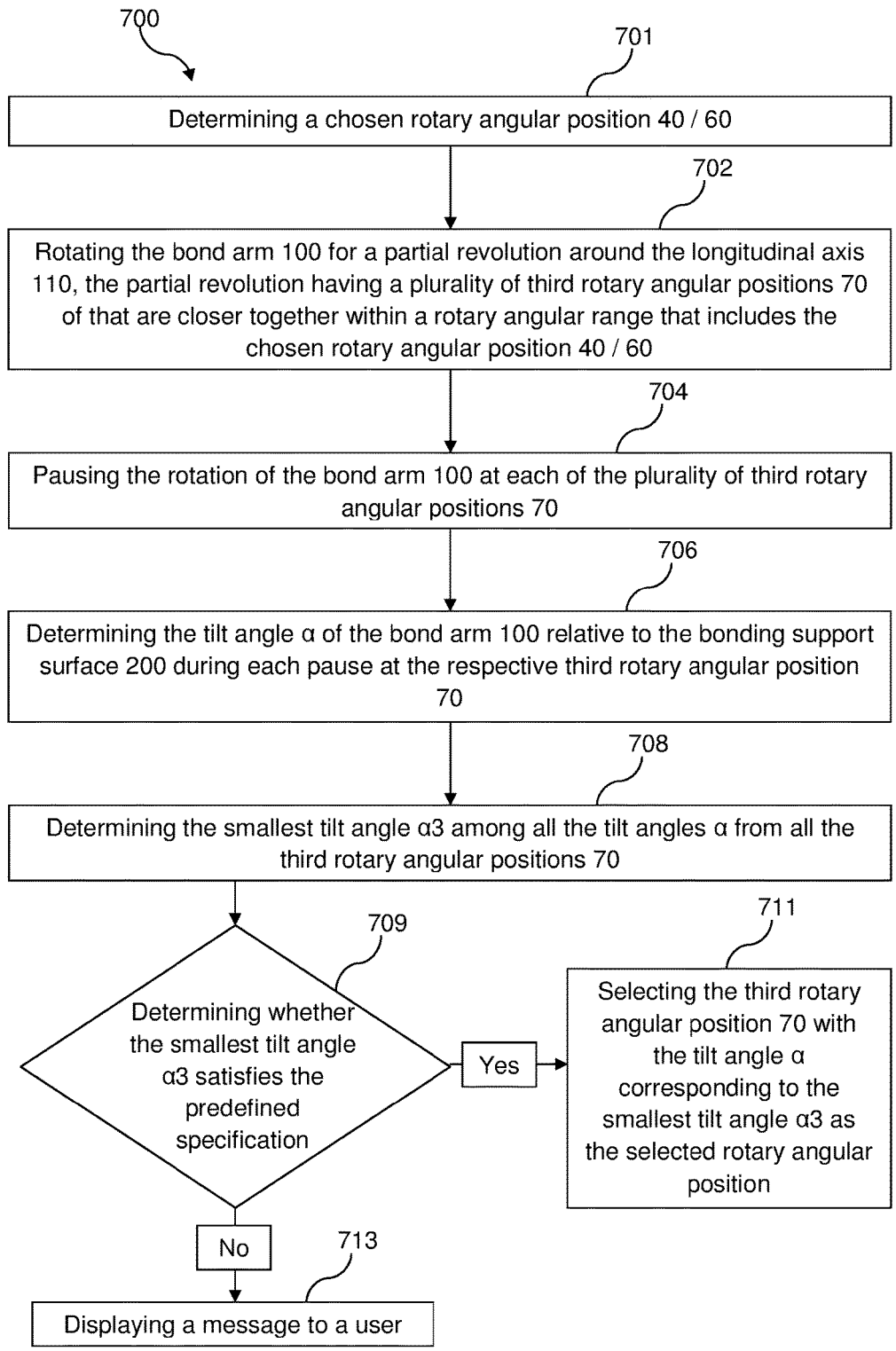
FIG. 8D illustrates a flowchart of another third selection process.

Referring to FIG. 8D, in a third example of the third selection process 700 performed in the step 616, the third selection process 700 comprises a step 701 of determining a chosen rotary angular position 40/60. As none of the tilt angles α from all rotary angular positions 40a-h and 60a-h satisfy the predefined specification, one of these would be determined as the chosen rotary angular position 40/60. Notably, one of the 8 first rotary angular positions 40a-h corresponds to the smallest tilt angle α1 and one of the 8 second rotary angular positions 60a-h corresponds to the smallest tilt angle α2. For example, the first rotary angular position 40d has the smallest tilt angle α1 and the second rotary angular position 60d has the smallest tilt angle α2. If α1 is smaller than α2, the step 701 determines the first rotary angular position 40d as the chosen rotary angular position 40d. If α2 is smaller than α1, the step 701 determines the second rotary angular position 60d as the chosen rotary angular position 60d.

Beginning from the chosen rotary angular position, e.g. 40d or 60d, the steps 702, 704, and 706 of the third selection process 700 are performed, as would be readily understood by the skilled person based on the above examples. The third rotary angular positions 70 reside within the rotary angular range that includes the chosen rotary angular position. After performing the tilt angle calculation process 500 for all the third rotary angular positions 70, the third selection process 700 proceeds to a step 708 of determining the smallest tilt angle α3 among all the tilt angles α from all the third rotary angular positions 70. The third selection process 700 further comprises a step 709 of determining whether the smallest tilt angle α3 satisfies the predefined specification. If yes, the step 709 proceeds to a step 711 of selecting the third rotary angular position 70 with the tilt angle α corresponding to the smallest tilt angle α3 as the selected rotary angular position.

If the smallest tilt angle α3 still does not satisfy the predefined specification, this means that a suitable rotary angular position cannot be found after the first selection process 400, second selection process 600, and third selection process 700. The bond arm 100 cannot be aligned substantially perpendicular to the bonding support surface 200. Accordingly, the bonding process may not be able to proceed as there is greater risk of uneven bump flatness, incomplete electrical connections, and/or cold joints. The step 709 proceeds to a step 713 of displaying a message on a computing device connected to the bonding apparatus 10. The message informs a user of the bonding apparatus 10 that a suitable rotary angular position cannot be found for performing the bonding process as none of the rotary angular positions 40, 60, and 70 has a tilt angle α that satisfies the predefined specification. The user may then be required to manually adjust the bonding apparatus 10, particularly the bond arm 100 and/or bond head 102, to change the orientation of the bond arm 100 relative to the bonding support surface 200, such as described above with reference to FIG. 2B.

Flowchart of First Selection Process 400, Second Selection Process 600, and Third Selection Process 700

Figure 9:
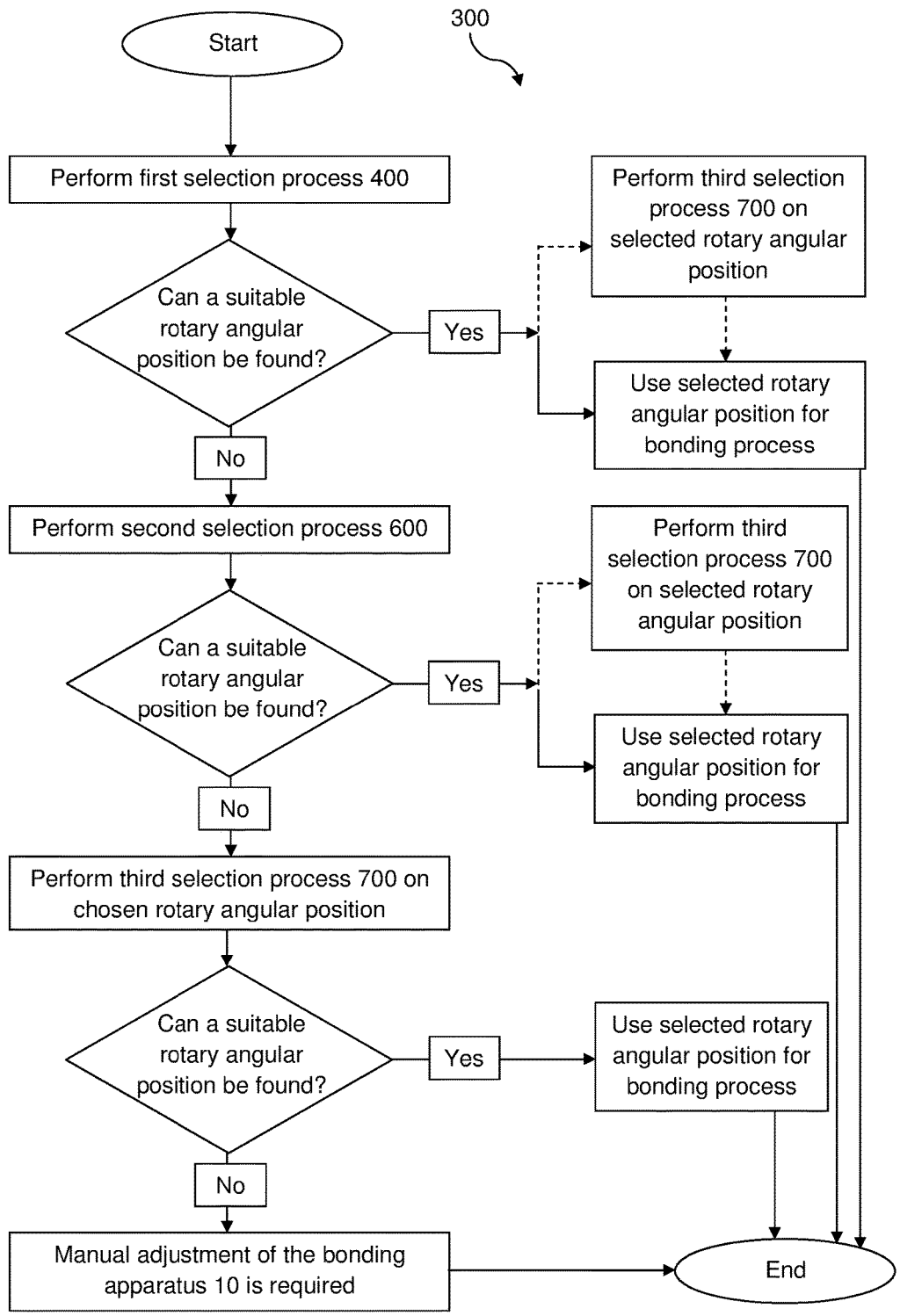
FIG. 9 illustrates a flowchart of the first selection process, second selection process, and third selection process.

The flowchart in FIG. 9 summarizes the method 300 including the first selection process 400, second selection process 600, and third selection process 700. The method 300 advantageously provides for automatic alignment of the bond arm 100 with respect to the bonding support surface 200. Particularly, the bond arm 100 is aligned to a selected rotary angular position which has a tilt angle α that satisfies the predefined specification, such that the bond arm 100 is aligned substantially perpendicular to the bonding support surface 200. As mentioned above, FIG. 3A schematically illustrates an exaggerated bond arm tilt of the bond arm 100 relative to the bonding support surface 200. At the rotary angular position shown in FIG. 3A, the tilt angle α is larger at around 30°, which does not satisfy the predefined specification, and as such the bond arm 100 is not aligned substantially perpendicular to the bonding support surface 200. FIG. 3B schematically illustrates an exaggerated bond arm tilt of the bond arm 100 after alignment by the method 300. At the rotary angular position shown in FIG. 3B, the tilt angle α is substantially close to 0° and satisfies the predefined specification, such that the bond arm 100 is aligned substantially perpendicular to the bonding support surface 200.

As the various processes and steps of the method 300 are performed electronically or via a computing device, the selection of a suitable or optimal rotary angular position can be automatically performed with minimal user intervention. Actuation and displacement of the various components of the bonding apparatus 10 for performing the method 300 may be performed by automated mechanisms and/or robotics as would be known to the skilled person. This automatic approach to bond arm alignment or adjustment of a misaligned bond arm significantly reduces the time required and the bonding process can become more efficient. Particularly, the method 300 is quick with a maximum required time of less than 10 minutes to pre-set the various parameters of the first selection process 400, second selection process 600, and/or third selection process 700. As user intervention is only required if an acceptable range of bond arm tilt (i.e. satisfying the predefined specification) cannot be found, the trial-and-error approach of mechanical adjustment such as for every tool change is eliminated or significantly reduced.

Figure 1A:
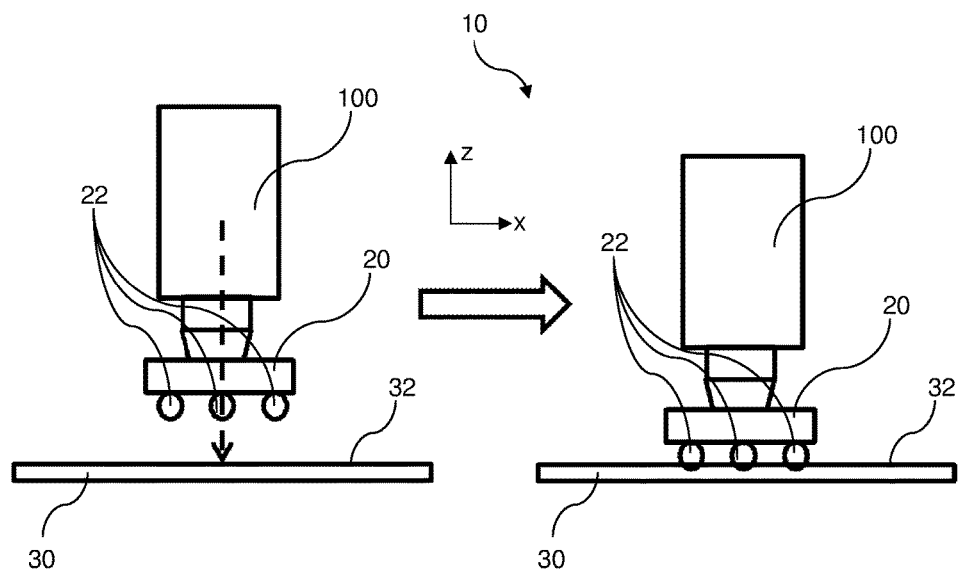
FIG. 1A illustrates a side view of a bonding apparatus with an ideal rotary angular position.
Figure 1B:
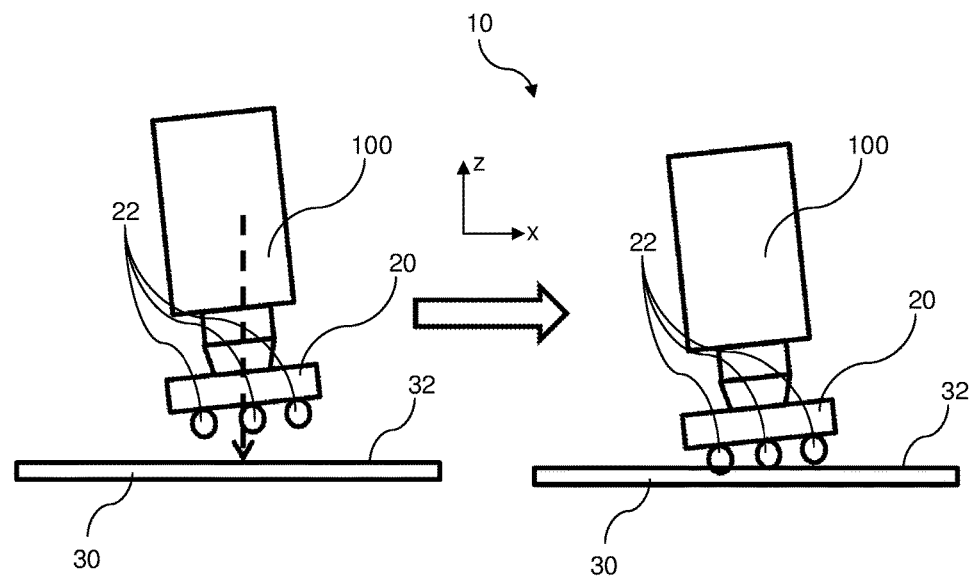
FIG. 1B illustrates a side view of a bonding apparatus with a non-ideal rotary angular position.

The selected rotary angular position would later be used as the ready position of the bond arm 100 for performing a flip chip bonding process. Referring back to FIG. 1A, by performing the bonding process at the selected rotary angular position, a semiconductor device 20 held at the collet surface 116 of the collet 104 at the bond arm 100 can be evenly bonded to a pad surface 32 of a substrate 30 disposed or supported on the bonding support surface 200. Substantially even bump flatness can be achieved as the solder bumps 22 can bond evenly with the pad surface 32, and the electrical connections between the semiconductor device 20 and the pad surface 32 are complete. Moreover, the risk of cold joints between the semiconductor device 20 and pad surface 32 during the bonding process is eliminated or at least significantly mitigated.

The selected rotary angular position enables the bond arm 100 to be substantially perpendicular to the bonding support surface 200, and correspondingly the collet surface 116 to be substantially parallel to the bonding support surface 200. In some embodiments, the collet 104 is circular and the orientation of the circular collet surface 116 viewed from the bonding support surface 200 is not critical as compared to the tilt angle α. The circular collet surface 116 remains substantially invariant when rotated about the centre thereof. However, in some other embodiments, the collet 104 may have a different shape and the collet surface 116 is not invariant when rotated about the centre thereof. For example, the collet 104 is rectangular and the orientation of the rectangular collet surface 116 becomes more critical. In order to perform the bonding process with a rectangular collet 104, at least 2 criteria must be satisfied:
  i. Tilt angle α satisfying the predefined specification; and
  ii. Rectangular collet surface 116 aligned with the bonding support surface 200.

During rotation of the bond arm 100 around the longitudinal axis 110 to find a suitable or optimal rotary angular position, the orientation of the rectangular collet surface 116 may be changed and become misaligned with the orientation of the semiconductor device 20 held at the collet surface 116. It is thus possible that at the selected rotary angular position, the tilt angle α satisfies the predefined specification but the rectangular collet surface 116 is misaligned with the orientation of the semiconductor device 20. One possible solution would be to use an additional motor to turn or rotate the rectangular collet 104 to align with the orientation of the semiconductor device 20, while maintaining the position and orientation of the bond arm 100 relative to the bonding support surface 200. Accordingly, the bond arm 100 remains stationary while the rectangular collet 104 is turned/rotated relative to the bond arm 100.

Another possible solution would be to fix the rectangular collet 104 such that the rectangular collet surface 116 always remains aligned with the orientation of the semiconductor device 20. The method 300 would be performed after the rectangular collet 104 is fixed relative to the bond arm 100. As such, during the method 300, only the bond arm 100 would be moved or rotated to find the rotary angular position with the tilt angle α that satisfies the predefined specification, while the rectangular collet 104 remains aligned with the orientation of the semiconductor device 20. The rectangular collet 104 may be fixed by means of a locking mechanism such as a guide pin.

The method 300, including the first selection process 400, second selection process 700, and third selection process 700 may be implemented on a system comprising the bonding apparatus 10 and a computing device connected thereto. The computing device comprises a processor and a memory configured to store computer-readable instructions, wherein when the instructions are executed, the processor performs various steps of the method 300. Accordingly, the method 300 may be referred to as a computerized method 300. The processor may alternatively be referred to as a central processor unit or CPU that is in communication with memory or memory devices. The memory stores non-transitory computer-readable instructions operative by the processor to perform various steps of the method 300 according to embodiments of the present disclosure. The memory may be referred to in some contexts as computer-readable storage media and/or non-transitory computer-readable media. Non-transitory computer-readable media include all computer-readable media, with the sole exception being a transitory propagating signal per se.

The computing device may be configured to display messages, e.g. alerts and notifications, to the user. For example, in the step 713, a message is displayed to inform the user that a suitable rotary angular position cannot be found for performing the flip chip bonding process. The computing device may also be configured to provide prompts for the user to input a response. For example, the computing device may prompt the user to decide whether or not to continue with the third selection process 700, such as in the optional steps 414 and 614. It will be appreciated that the computing device may further be configured to require user input, e.g. selecting Yes/No options, at various stages of the method 300, or more specifically various steps of the first selection process 400, second selection process 600, and third selection process 700.

In the foregoing detailed description, embodiments of the present disclosure in relation to a method and system for automatically aligning a bond arm with respect to a bonding support surface are described with reference to the provided figures. The description of the various embodiments herein is not intended to call out or be limited only to specific or particular representations of the present disclosure, but merely to illustrate non-limiting examples of the present disclosure. The present disclosure serves to address at least one of the mentioned problems and issues associated with the prior art. Although only some embodiments of the present disclosure are disclosed herein, it will be apparent to a person having ordinary skill in the art in view of this disclosure that a variety of changes and/or modifications can be made to the disclosed embodiments without departing from the scope of the present disclosure. Therefore, the scope of the disclosure as well as the scope of the following claims is not limited to embodiments described herein.

The invention claimed is:

1. A method for automatically aligning a bond arm with respect to a bonding support surface for supporting a substrate during a bonding process, the method comprising:
  rotating the bond arm for a first revolution around a longitudinal axis through a bond head moveably coupled to the bond arm, the first revolution including a plurality of predefined rotary angular positions;
  pausing the rotation of the bond arm at each of the plurality of rotary angular positions;
  determining a tilt angle of the bond arm relative to the bonding support surface during each pause at the respective rotary angular position; and
  selecting the rotary angular position of the bond arm which has a tilt angle that satisfies a predefined specification, such that the bond arm is aligned substantially perpendicular to the bonding support surface.

2. The method according to claim 1, further comprising performing a second selection process comprising a step of rotating the bond arm for a second revolution around the longitudinal axis, the second revolution including a plurality of second rotary angular positions that are different from the predefined rotary angular positions of the first revolution.

3. The method according to claim 2, the second selection process further comprising determining the tilt angle of the bond arm relative to the bonding support surface during each pause at the respective second rotary angular position.

4. The method according to claim 3, the second selection process further comprising selecting the second rotary angular position of the bond aim which has a tilt angle that satisfies the predefined specification, such that the bond arm is aligned substantially perpendicular to the bonding support surface.

5. The method according to claim 1, further comprising performing a third selection process comprising rotating the bond arm across a plurality of third rotary angular positions that are closer together within a rotary angular range that includes the selected rotary angular position.

6. The method according to claim 5, the third selection process further comprising determining the tilt angle of the bond arm relative to the bonding support surface during each pause at the respective finer rotary angular position.

7. The method according to claim 1, wherein determining the tilt angle comprises probing heights of three or more distinct points on a collet surface of the bond arm with a reference pin arranged perpendicular to the bonding support surface.

8. The method according to claim 7, wherein determining the tilt angle further comprises displacing the bond arm relative to the reference pin, such that the reference pin engages each of the three or more distinct points on the collet surface.

9. The method according to claim 8, wherein determining the tilt angle further comprises calculating a planar inclination of the collet surface relative to the bonding support surface based on the probed heights of the three or more distinct points on the collet surface.

10. The method according to claim 9, wherein the predefined specification provides a limit to an allowable planar inclination of the collet surface relative to the bonding support surface.

11. A system for automatically aligning a bond arm with respect to a bonding support surface, the system comprising:
a bonding apparatus for performing a bonding process, comprising:
the bond arm;
a bond head moveably coupled to the bond arm; and
the bonding support surface for supporting a substrate during the bonding process;
and the system further comprising:
a computing device connected to the bonding apparatus, the computing device comprising a processor and a memory configured to store computer-readable instructions, wherein when the instructions are executed, the processor performs steps comprising:
rotating the bond arm for a first revolution around a longitudinal axis through a bond head moveably coupled to the bond arm, the first revolution including a plurality of predefined rotary angular positions;
pausing the rotation of the bond arm at each of the plurality of rotary angular positions;
determining a tilt angle of the bond arm relative to the bonding support surface during each pause at the respective rotary angular position; and
selecting the rotary angular position of the bond arm which has a tilt angle that satisfies a predefined specification such that the bond arm is aligned substantially perpendicular to the bonding support surface.

* * * * *